(12) United States Patent
Tsutsumi

(10) Patent No.: US 12,264,270 B2
(45) Date of Patent: Apr. 1, 2025

(54) METHOD FOR PRODUCING CURED PRODUCT OF HEAT-CURABLE MALEIMIDE RESIN COMPOSITION

(71) Applicant: Shin-Etsu Chemical Co., Ltd., Tokyo (JP)

(72) Inventor: Yoshihiro Tsutsumi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 240 days.

(21) Appl. No.: 18/127,122

(22) Filed: Mar. 28, 2023

(65) Prior Publication Data

US 2023/0340299 A1 Oct. 26, 2023

(30) Foreign Application Priority Data

Apr. 25, 2022 (JP) .................. 2022-071347

(51) Int. Cl.
*B29C 65/00* (2006.01)
*B32B 7/12* (2006.01)
(Continued)

(52) U.S. Cl.
CPC ............... *C09J 5/06* (2013.01); *B32B 7/12* (2013.01); *B32B 9/045* (2013.01); *B32B 27/08* (2013.01);
(Continued)

(58) Field of Classification Search
CPC .... B29C 65/02; B29C 65/405; B29C 65/4835
See application file for complete search history.

(56) References Cited

U.S. PATENT DOCUMENTS 10,434,750 B2  10/2019  Takeuchi et al.
2019/0355638 A1* 11/2019 Tsutsumi .............. C08L 79/085
(Continued)

FOREIGN PATENT DOCUMENTS

JP  2013-211348 A  10/2013
JP  2016-131243 A  7/2016
(Continued)

OTHER PUBLICATIONS

"Metal Surface Technology", The Journal of the Metal Finishing Society, 1977, vol. 28, No. 4, pp. 196-201.

*Primary Examiner* — Philip C Tucker
*Assistant Examiner* — Nickolas R Harm
(74) *Attorney, Agent, or Firm* — Birch, Stewart, Kolasch & Birch, LLP

(57) ABSTRACT

Provided is a method for producing a cured product of a heat-curable maleimide resin composition, that causes no curing failure and no appearance failure associated therewith. The method is for producing a cured product of a heat-curable maleimide resin composition containing:
  (A) a maleimide compound having at least one dimer acid frame-derived hydrocarbon group per molecule; and
  (B) a radical polymerization initiator,
wherein the method includes:
  a laminating step of obtaining a laminate by laminating a release sheet, a resin layer made of the heat-curable maleimide resin composition, and a base material, in such order; and
  a curing step of heating the laminate to a temperature at which the heat-curable maleimide resin composition of the resin layer cures, without removing the release sheet of the laminate.

8 Claims, 2 Drawing Sheets

(51) Int. Cl.
*B32B 9/04* (2006.01)
*B32B 27/08* (2006.01)
*B32B 27/36* (2006.01)
*B32B 37/12* (2006.01)
*C09J 5/06* (2006.01)
*C09J 179/08* (2006.01)
*B29C 65/02* (2006.01)
*B29C 65/40* (2006.01)
*B29C 65/48* (2006.01)

(52) U.S. Cl.
CPC .......... *B32B 27/36* (2013.01); *B32B 37/1207* (2013.01); *C09J 179/08* (2013.01); *B29C 65/02* (2013.01); *B29C 65/405* (2013.01); *B29C 65/4835* (2013.01); *B32B 2255/10* (2013.01); *B32B 2255/26* (2013.01); *B32B 2307/7376* (2023.05); *C09J 2479/08* (2013.01)

(56) References Cited

U.S. PATENT DOCUMENTS

| | | | |
|---|---|---|---|
| 2020/0048464 A1* | 2/2020 | Tsutsumi | C08L 83/08 |
| 2020/0079954 A1* | 3/2020 | Kushihara | C08K 5/14 |
| 2021/0024749 A1* | 1/2021 | Osada | C08K 3/22 |

FOREIGN PATENT DOCUMENTS

| | | |
|---|---|---|
| JP | 2016-131244 A | 7/2016 |
| JP | 2018-201024 A | 12/2018 |
| WO | WO 2016/114287 A1 | 7/2016 |

\* cited by examiner

METHOD FOR PRODUCING CURED PRODUCT OF HEAT-CURABLE MALEIMIDE RESIN COMPOSITION

BACKGROUND OF THE INVENTION

Field of the Invention

The present invention relates to a method for producing a cured product of a heat-curable maleimide resin composition.

Background Art

In recent years, a next-generation communication system known as 5G has prevailed, and even a next-next-generation communication system called 6G is already under development, where attempts are being made to realize a communication with a higher speed, a larger capacity and a lower latency than ever before. The realization of these communication systems requires materials for use in a high-frequency band, and it is critical to reduce a transmission loss as a countermeasure for noise.

A transmission loss is a sum of a conductor loss and a dielectric loss; it is necessary to lower the roughness of the surface of a metal foil used to reduce a conductor loss. Meanwhile, since a dielectric loss is proportionate to a product of a square root of a relative permittivity and a dielectric tangent, as an insulating material, it is demanded that there be developed one with excellent dielectric properties (i.e. with a low relative permittivity and a low dielectric tangent).

Particularly, it is for substrate purposes that such insulating material with excellent dielectric properties is required. There are now increasingly employed a product known as a reactive polyphenylene ether resin (PPE) in the case of a rigid substrate; and products known as a liquid crystal polymer (LCP) and a modified polyimide (MPI) with improved properties in the case of a flexible printed-circuit board (FPC).

In this regard, reports have been made on substantially using, as a resin of a substrate, a dimer diamine frame-containing maleimide compound (specific maleimide compound) (JP-A-2016-131243, JP-A-2016-131244, WO2016/114287, and JP-A-2018-201024). As opposed to the properties of a general maleimide resin, while a specific maleimide compound has a low glass-transition temperature (Tg) and a high coefficient of thermal expansion (CTE), it also has a number of merits such as significantly excellent dielectric properties, a flexible property, an excellent adhesive force to metals or the like, and a capability of realizing multi (high)-layering as being a heat-curable resin; a wide range of researches and developments are conducted with regard to such specific maleimide compound.

Further, emphases are put on the flexibility of a specific maleimide compound rather than the dielectric properties thereof depending on its use; studies have also been made on its usage as a protective material used to, for example, restrict warpage of a wafer (JP-A-2013-211348). In these compositions, curing occurs by a thermal radical reaction, and a radical reaction is usually susceptible to oxygen inhibition ("The journal of the Metal Finishing Society" 1977, No. 4, Vol 28, 196-201), which requires there to be established an oxygen-free environment such as a nitrogen atmosphere at the time of curing; however, it is difficult to readily create an oxygen-free high-temperature atmosphere, and there have been problems where curing failures and appearance failures associated therewith have occurred.

SUMMARY OF THE INVENTION

Thus, it is an object of the present invention to provide a method for producing a cured product of a heat-curable maleimide resin composition containing a specific maleimide compound and a radical polymerization initiator, that causes no curing failure and no appearance failure associated therewith.

The inventor of the present invention diligently conducted a series of studies to solve the above problems, and completed the invention by finding that the aforementioned object can be achieved by the following method for producing a cured product of a heat-curable maleimide resin composition.

[1]
A method for producing a cured product of a heat-curable maleimide resin composition containing:
(A) a maleimide compound having at least one dimer acid frame-derived hydrocarbon group per molecule; and
(B) a radical polymerization initiator,
wherein the method comprises:
a laminating step of obtaining a laminate by laminating a release sheet, a resin layer made of the heat-curable maleimide resin composition, and a base material, in such order; and
a curing step of heating the laminate to a temperature at which the heat-curable maleimide resin composition of the resin layer cures, without removing the release sheet of the laminate.

[2]
The method for producing the cured product of the heat-curable maleimide resin composition according to [1], wherein the laminating step is a step in which another release sheet is to be placed on a surface of the base material that is not in contact with the resin layer to obtain a laminate having at least four layers which are the release sheet, the resin layer made of the heat-curable maleimide resin composition, the base material, and the release sheet.

[3]
The method for producing the cured product of the heat-curable maleimide resin composition according to [1] or [2], wherein the component (A) is a maleimide compound represented by the following formulae (1) and/or (2):

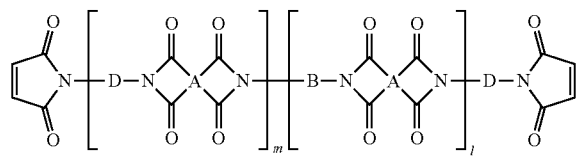

wherein, A independently represents a tetravalent organic group having a cyclic structure; B independently represents a divalent alicyclic hydrocarbon group having 6 to 60 carbon atoms; D independently represents a divalent hydrocarbon group having 6 to 200 carbon atoms, in which at least one D is a dimer acid frame-derived hydrocarbon group; m is 1 to 100; l is 1 to 200; no restrictions are imposed on an order of each repeating unit identified by m and l, and a bonding pattern may be alternate, block or random,

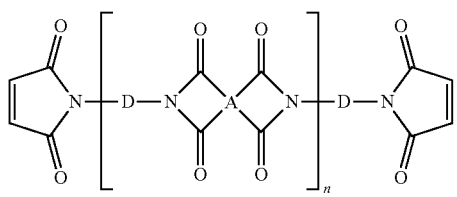

(2)

wherein A independently represents a tetravalent organic group having a cyclic structure; D independently represents a divalent hydrocarbon group having 6 to 200 carbon atoms, in which at least one D is a dimer acid frame-derived hydrocarbon group; n is 0 to 100.

[4]

The method for producing the cured product of the heat-curable maleimide resin composition according to [3], wherein A in the formulae (1) and (2) is a tetravalent organic group represented by any of the following structural formulae:

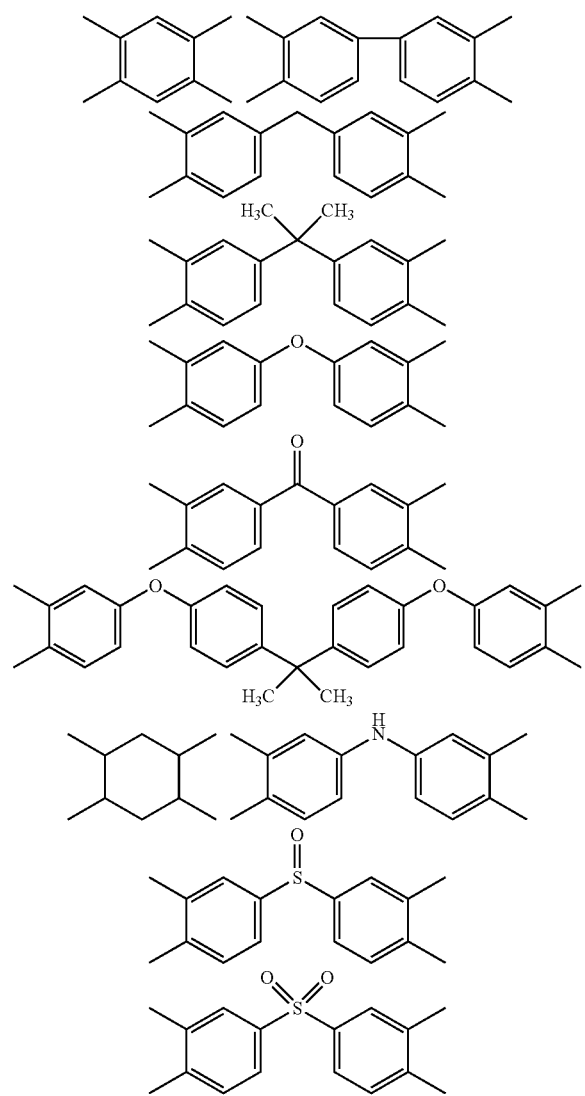

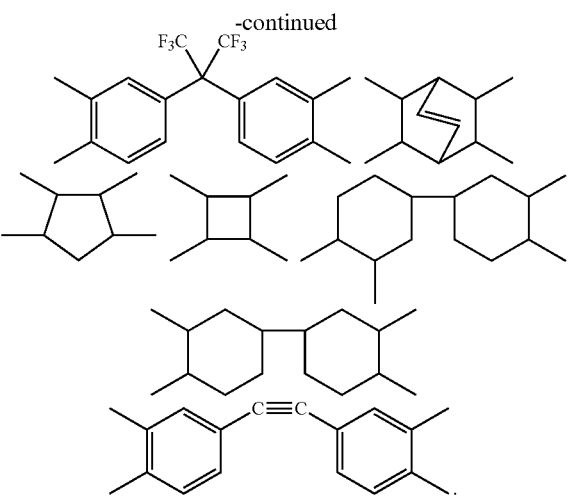

[5]

The method for producing the cured product of the heat-curable maleimide resin composition according to any one of [1] to [4], wherein the radical polymerization initiator as the component (B) is an organic peroxide.

[6]

The method for producing the cured product of the heat-curable maleimide resin composition according to any one of [1] to [5], wherein the release sheet is a plastic film in which a surface that is to be in contact with the resin layer made of the heat-curable maleimide resin composition has been subjected to a mold release treatment.

[7]

The method for producing the cured product of the heat-curable maleimide resin composition according to any one of [1] to [6], wherein the base material is at least one kind selected from a metal foil, a silicon wafer, a SiC wafer, a sapphire wafer, a compound semiconductor wafer, an organic substrate and a ceramic substrate.

[8]

The method for producing the cured product of the heat-curable maleimide resin composition according to any one of [1] to [7], wherein the resin layer has a thickness of 1 to 300 μm.

The method of the present invention for producing the cured product of the heat-curable maleimide resin composition containing the specific maleimide compound and the radical polymerization initiator is one causing no curing failure in the cured product and no appearance failure associated therewith; a curing failure- and appearance failure-less cured product can be obtained with a relatively simple method without necessitating an oxygen-free high-temperature atmosphere such as a nitrogen atmosphere.

DETAILED DESCRIPTION OF THE INVENTION

Figure 1A:
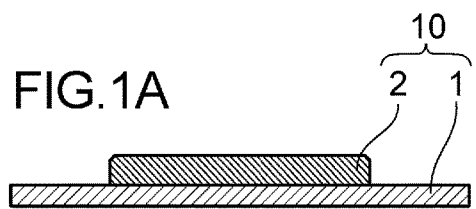
FIG. 1A is a schematic drawing showing part of an example of a method of the present invention for producing a cured product.
Figure 1B:
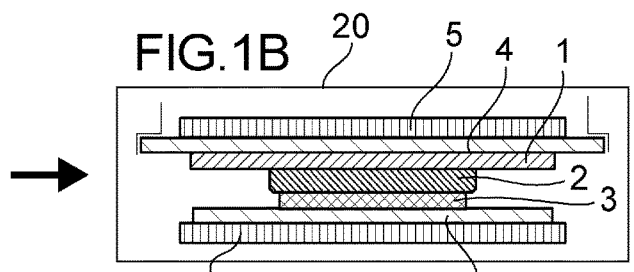
FIG. 1B is a schematic drawing showing part of the example of the method of the present invention for producing the cured product.
Figure 1C:
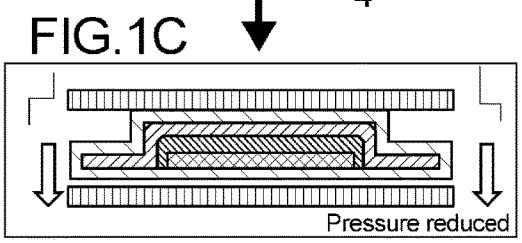
FIG. 1C is a schematic drawing showing part of the example of the method of the present invention for producing the cured product.
Figure 1D:
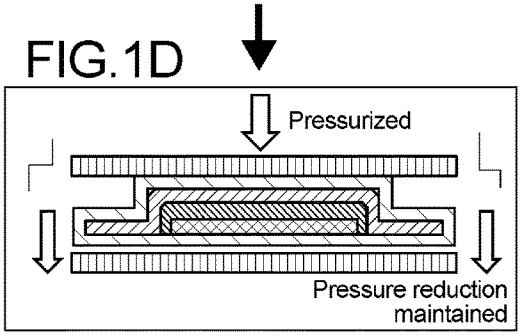
FIG. 1D is a schematic drawing showing part of the example of the method of the present invention for producing the cured product.
Figure 1E:
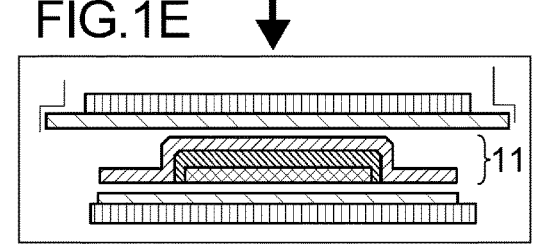
FIG. 1E is a schematic drawing showing part of the example of the method of the present invention for producing the cured product.
Figure 1F:
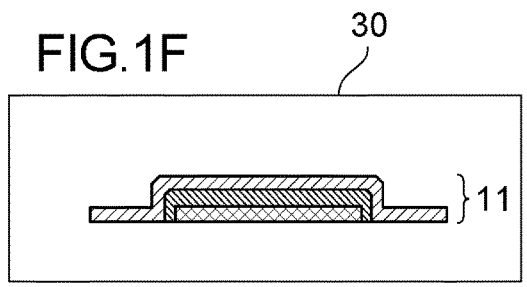
FIG. 1F is a schematic drawing showing part of the example of the method of the present invention for producing the cured product.

The present invention is described in greater detail hereunder.

A method of the present invention for producing a cured product of a heat-curable maleimide resin composition has:
- a laminating step of obtaining a laminate by laminating a release sheet, a resin layer made of a heat-curable maleimide resin composition containing later-described components (A) and (B), and a base material, in such order; and
- a curing step of heating the laminate to a temperature at which the heat-curable maleimide resin composition of the resin layer cures, without removing the release sheet of the laminate.

As for the cured product obtained by the production method of the present invention, described in detail below are the heat-curable maleimide resin composition before curing; and the components contained in this composition.

Heat-Curable Maleimide Resin Composition (A) Maleimide Compound Having at Least One Dimer Acid Frame-Derived Hydrocarbon Group Per Molecule A component (A) is a maleimide compound having at least one dimer acid frame-derived hydrocarbon group per molecule. A dimer acid frame-derived hydrocarbon group(s) are effective in terms of exhibiting superior dielectric properties, a low stress property and a high adhesiveness.

A dimer acid refers to a liquid dibasic acid whose main component is a dicarboxylic acid having 36 carbon atoms, which is produced by dimerizing an unsaturated fatty acid having 18 carbon atoms and employing a natural substance such as a vegetable fat or oil as its raw material. A dimer acid may have multiple structures as opposed to one single type of frame, and there exist several types of isomers. Typical dimer acids are categorized under the names of (a) linear type, (b) monocyclic type, (c) aromatic ring type, and (d) polycyclic type. In this specification, a dimer acid frame refers to a group induced from a dimer diamine having a structure established by substituting the carboxy groups in such dimer acid with primary aminomethyl groups. That is, as a dimer acid frame, the component (A) may be exemplified by, but is not limited to groups obtained by substituting the two carboxy groups in any of the following dimer acids (a) to (d) with methylene groups.

Further, as for the dimer acid frame-derived hydrocarbon group in the maleimide compound as the component (A), more preferred from the perspectives of heat resistance and reliability of a cured product are those having a structure with a reduced number of carbon-carbon double bonds in the dimer acid frame-derived hydrocarbon group due to a hydrogenation reaction.

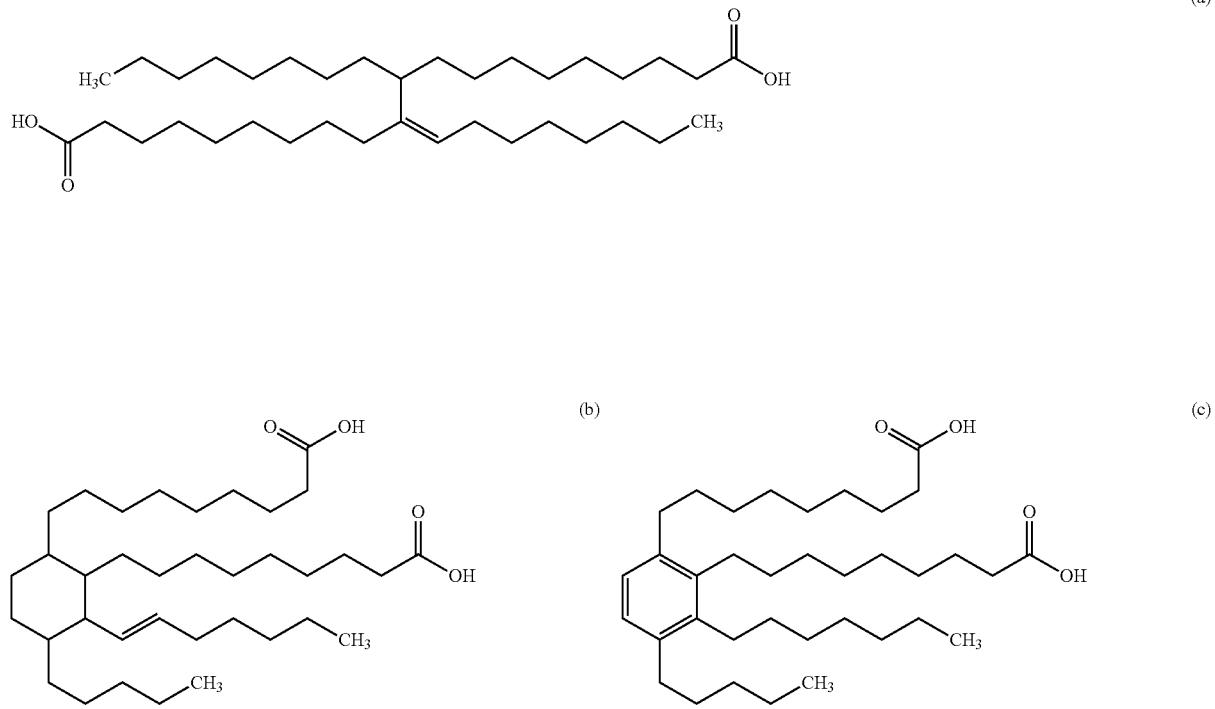

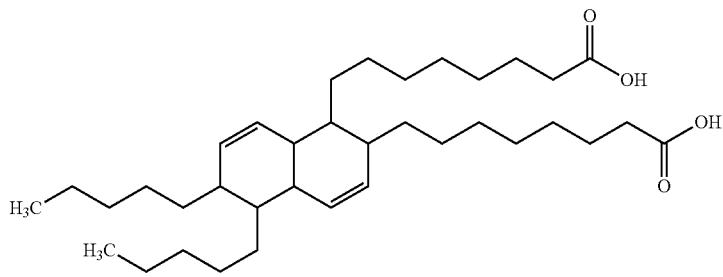

(d)

Particularly, it is preferred that the component (A) be a maleimide compound represented by the following formula (1) and/or a maleimide compound represented by the following formula (2).

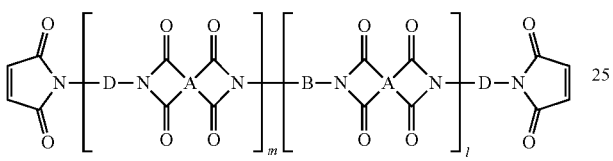

(1)

In the formula (1), A independently represents a tetravalent organic group having a cyclic structure; B independently represents a divalent alicyclic hydrocarbon group having 6 to 60 carbon atoms; D independently represents a divalent hydrocarbon group having 6 to 200 carbon atoms, where at least one D is a dimer acid frame-derived hydrocarbon group; m is 1 to 100; l is 1 to 200. There are no restrictions imposed on the order of each repeating unit identified by m and l; the bonding pattern may be alternate, block or random.

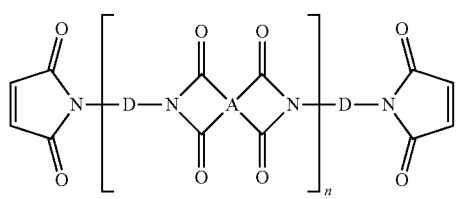

(2)

In the formula (2), A independently represents a tetravalent organic group having a cyclic structure, as is the case in the formula (1); D independently represents a divalent hydrocarbon group having 6 to 200 carbon atoms, where at least one D is a dimer acid frame-derived hydrocarbon group, as is the case in the formula (1). n is 0 to 100.

A composition containing the maleimide compound represented by the formula (1) has a high melt viscosity before curing. However, a cured product of such composition has not only more excellent dielectric properties, but also a higher adhesive force to a metal foil such as a copper foil, as compared to if containing a general maleimide compound having many aromatic rings; the cured product of such composition is also less susceptible to humidity as it absorbs less moisture, as compared to a general heat-curable resin such as an epoxy resin. Further, in the case of a composition containing the maleimide compound represented by the formula (1), a cured product thereof has a higher Tg and therefore a higher reliability as compared to a composition containing the maleimide compound represented by the formula (2).

In the formula (1), A independently represents a tetravalent organic group having a cyclic structure, and is preferably a tetravalent organic group represented by any of the following structural formulae.

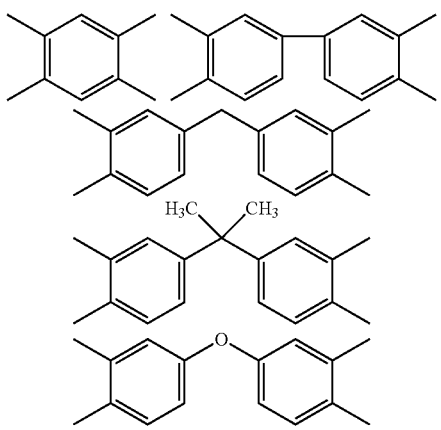

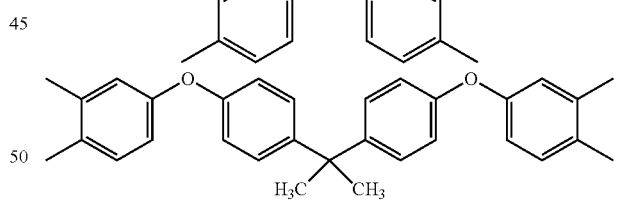

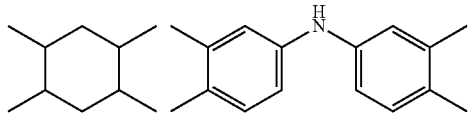

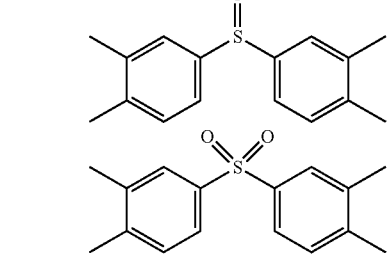

-continued

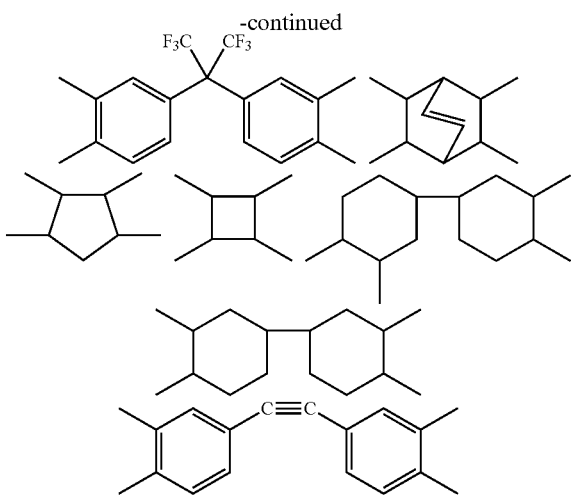

In the above structural formulae, bonds that are yet unbonded to substituent groups are to be bonded to carbonyl carbons forming cyclic imide structures in the formula (1).

Further, in the formula (1), D independently represents a divalent hydrocarbon group having 6 to 200, preferably 8 to 100, more preferably 10 to 50 carbon atoms. Particularly, it is preferred that this divalent hydrocarbon group be a branched divalent hydrocarbon group with at least one of the hydrogen atoms in the aforementioned divalent hydrocarbon group being substituted by an alkyl group or alkenyl group having 6 to 200, preferably 8 to 100, more preferably 10 to 50 carbon atoms. The branched divalent hydrocarbon group may be any of a saturated aliphatic hydrocarbon group and an unsaturated hydrocarbon group, and may have an alicyclic structure or an aromatic ring structure in the midway of the molecular chain.

One specific example of such branched divalent hydrocarbon group may be a divalent hydrocarbon group derived from a dual-end diamine called dimer diamine. Thus, it is particularly preferred that D be a group obtained by substituting each of the two carboxy groups in any of the above dimer acids (a) to (d) with a methylene group; and there is at least one such dimer acid frame-derived hydrocarbon group per molecule.

Further, in the formula (1), B independently represents a divalent alicyclic hydrocarbon group having 6 to 60 carbon atoms, preferably a divalent aliphatic hydrocarbon group, more preferably a divalent aliphatic hydrocarbon group having 6 to 30 carbon atoms. As such aliphatic hydrocarbon group, preferred are those having a cyclohexane frame; as a group having such cyclohexane frame, there may be employed a group having one cyclohexane ring, such as that expressed by the following formula (3); or a polycyclic group with multiple cyclohexane rings being either bonded together via alkylene group(s) or bridged.

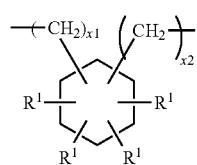

(3)

In the formula (3), $R^1$ independently represents a hydrogen atom or an alkyl group having 1 to 5 carbon atoms; x1 and x2 each independently represent a number of 0 to 4.

Here, specific examples of $R^1$ include a hydrogen atom, a methyl group, an ethyl group, an n-propyl group, an isopropyl group, an n-butyl group, an isobutyl group and a t-butyl group. Particularly, a hydrogen atom and a methyl group are preferred. Here, $R^1$s may be identical to or different from one another.

Further, x1 and x2 each independently represent a number of 0 to 4, preferably a number of 0 to 2. Here, x1 and x2 may be identical to or different from each other.

Specific examples of B include the divalent alicyclic hydrocarbon groups represented by the following structural formulae.

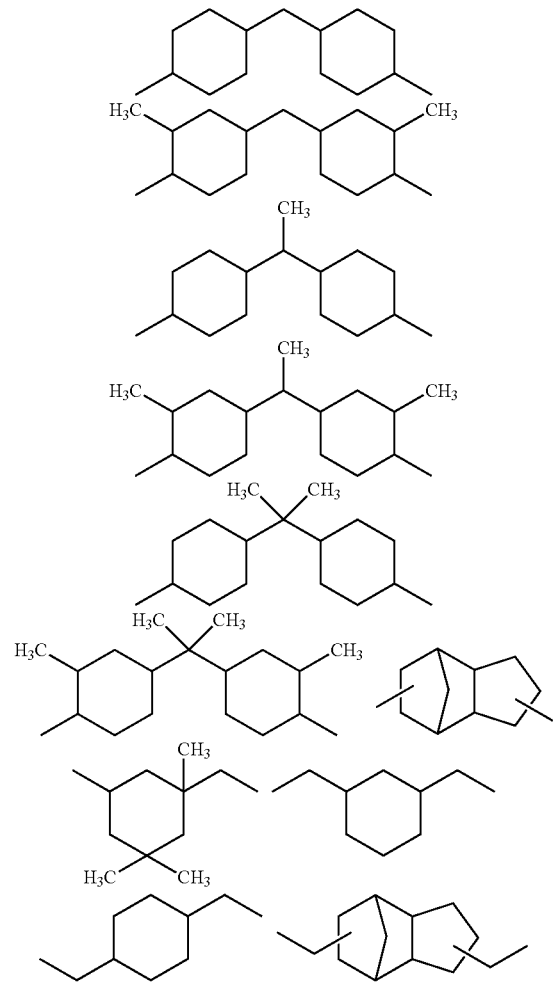

In the above structural formulae, bonds that are yet unbonded to substituent groups are to be bonded to nitrogen atoms forming cyclic imide structures in the formula (1).

In the formula (1), m is 1 to 100, preferably 1 to 60, more preferably 2 to 50; l is 1 to 200, preferably 1 to 50, more preferably 3 to 40. Extremely large values of m and l may lead to an impaired fluidity and a poor moldability. There are no restrictions on the order of each repeating unit identified by m and l; the bonding pattern may be alternate, block or random. A block pattern is preferred in terms of easiness in achieving a higher Tg.

A composition containing the maleimide compound represented by the formula (2) can be turned into a cured product exhibiting more excellent dielectric properties, particularly even in the high-frequency region, as compared to if containing a different and general maleimide compound having many aromatic rings. Further, a composition containing the maleimide compound represented by the formula (2) shall exhibit an even stronger adhesive force to a copper foil as compared to a composition containing the maleimide compound represented by the formula (1).

In the formula (2), A, as is the case with A in the formula (1), independently represents a tetravalent organic group having a cyclic structure, and is preferably any one of the tetravalent organic groups represented by the following structural formulae.

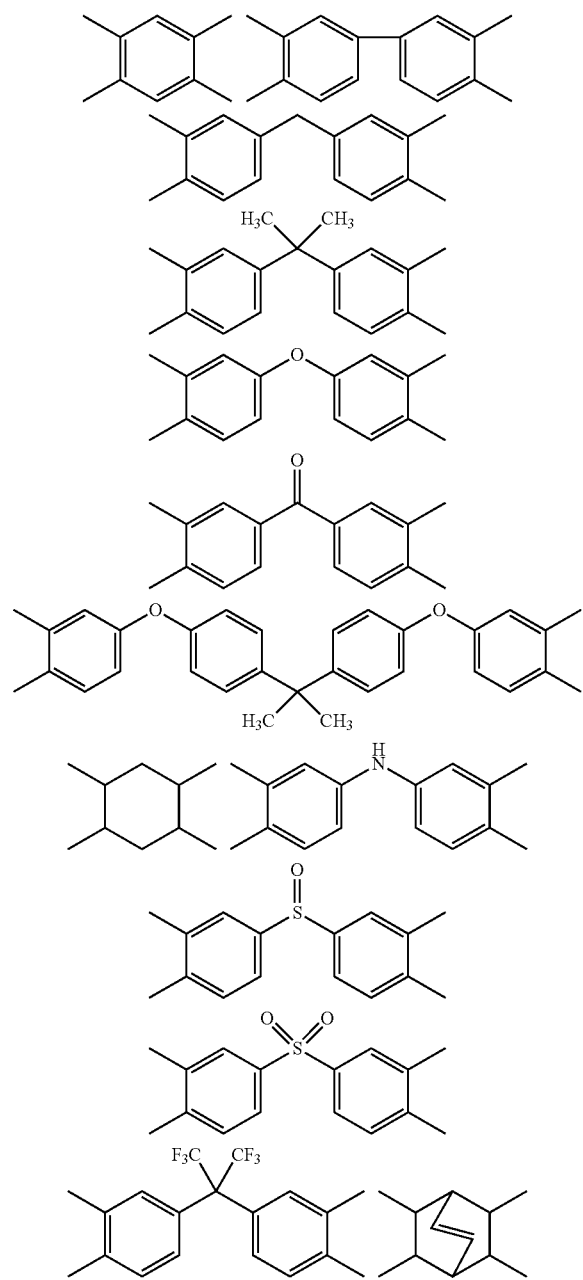

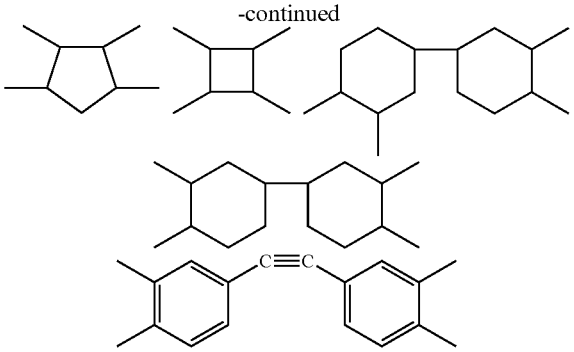

In the above structural formulae, bonds that are yet unbonded to substituent groups are to be bonded to carbonyl carbons forming cyclic imide structures in the formula (2).

Further, in the formula (2), D, as is the case with D in the formula (1), independently represents a divalent hydrocarbon group having 6 to 200, preferably 8 to 100, more preferably 10 to 50 carbon atoms. As is the case with D in the formula (1), it is preferred that D in the formula (2) be a branched divalent hydrocarbon group with at least one of the hydrogen atoms in the aforementioned divalent hydrocarbon group being substituted by an alkyl group or alkenyl group having 6 to 200, preferably 8 to 100, more preferably 10 to 50 carbon atoms. The branched divalent hydrocarbon group may be any of a saturated aliphatic hydrocarbon group and an unsaturated hydrocarbon group, and may have an alicyclic structure or an aromatic ring structure in the midway of the molecular chain.

One specific example of such branched divalent hydrocarbon group may be a divalent hydrocarbon group derived from a dual-end diamine called dimer diamine. Thus, it is particularly preferred that D be a group obtained by substituting each of the two carboxy groups in any of the above dimer acids (a) to (d) with a methylene group; and there is at least one such dimer acid frame-derived hydrocarbon group per molecule.

In the formula (2), n is 0 to 100, preferably 0 to 60, more preferably 0 to 50. An extremely large value of n may lead to an impaired solubility and fluidity, and a poor moldability.

There are no particular restrictions on the number average molecular weight of the maleimide compound(s) as the component (A); in terms of handling property of a composition, the number average molecular weight thereof is preferably 800 to 50,000, more preferably 900 to 30,000. Further, other than the maleimide compounds represented by the formulae (1) and/or (2), the component (A) may further contain a different maleimide compound having at least one dimer acid frame-derived hydrocarbon group per molecule; one kind of such component (A) may be used alone, or two or more kinds thereof may be used in combination.

Here, the number average molecular weight mentioned in the present invention refers to a number average molecular weight that is measured by gel permeation chromatography (GPC) under the following conditions, using polystyrene as a reference substance.

[Measurement Conditions]
Developing solvent: Tetrahydrofuran (THF)
Flow rate: 0.35 mL/min
Detector: Differential refractive index detector (RI)
Column: TSK Guardcolumn Super H-L
TSK gel Super HZ4000 (4.6 mm I.D.×15 cm×1)
TSK gel Super HZ3000 (4.6 mm I.D.×15 cm×1)
TSK gel Super HZ2000 (4.6 mm I.D.×15 cm×2)

(All Manufactured by Tosoh Corporation)
Column Temperature: 40° C.
Sample Injection Volume: 5 µL (THF Solution with a Concentration of 0.2% by Mass)

(B) Radical Polymerization Initiator

A radical polymerization initiator as a component (B) is added to promote a crosslinking reaction of the maleimide compound as the component (A), and a radical polymerization reaction between the maleimide groups in the component (A) and reactive groups capable of reacting with these maleimide groups. The method of the present invention for producing a cured product can exert a high effect particularly with regard to thermal radical polymerization.

There are no particular restrictions on the component (B) so long as it is capable of promoting a radical polymerization reaction, examples of which may include an organic peroxide such as diallyl peroxide, dialkyl peroxide, peroxide carbonate and hydroperoxide; and an azo compound such as azoisobutyronitrile and 1,1'-azobis(cyclohexanecarbonitrile). An organic peroxide is preferably used in terms of properties after curing, and ease in controlling the reaction.

Examples of such organic peroxide include dicumyl peroxide, t-butyl peroxybenzoate, t-amyl peroxybenzoate, dibenzoyl peroxide, dilauroyl peroxide, 2,5-dimethyl-2,5-di(t-butylperoxy)hexane, 1,1-di(t-butylperoxy)cyclohexane, di-t-butyl peroxide, and dibenzoyl peroxide.

It is preferred that the radical polymerization initiator be added in an amount of 0.05 to 10 parts by mass, more preferably 0.1 to 5 parts by mass, per 100 parts by mass of the component (A). Further, if the composition is to contain a later-described different heat-curable resin, the radical polymerization initiator is added in an amount of 0.05 to 10 parts by mass, particularly preferably 0.1 to 5 parts by mass, per 100 parts by mass of a sum total of the component (A) and the other heat-curable resin component. It is preferable if the amount of the radical polymerization initiator is within these ranges, because there shall exist no concern that curing may take place either too slowly or too quickly at the time of molding the maleimide resin composition. Further, in such case, the cured product obtained will also exhibit a favorable balance between heat resistance and moisture resistance.

One kind of the radical polymerization initiator as the component (B) may be used alone, or two or more kinds thereof may be used in combination. Further, a later-described different reaction initiator (reaction promoter) may be used in combination with the component (B) so long as the effects of the component (B) will not be impaired.

In the heat-curable maleimide resin composition used in the method of the present invention for producing a cured product, the component (A) is preferably contained by an amount of 30 to 99% by mass, more preferably 40 to 99% by mass, per the total amount of the composition.

Other Additives

The heat-curable maleimide resin composition used in the method of the present invention for producing a cured product, may further contain various additives as necessary, on the premise that the effects of the present invention will not be impaired. Examples of these additives are as follows.

Inorganic Filler

An inorganic filler may be added for the purpose of improving the strength and rigidity of the cured product of the heat-curable maleimide resin composition used in the method of the present invention for producing a cured product, or adjusting a thermal expansion coefficient and a dimension stability of the cured product. The inorganic filler may be one that is normally added to an epoxy resin composition and a silicone resin composition; preferred are boron nitride and silica particles such as spherical silica, molten silica and crystalline silica, in terms of avoiding raising the relative permittivity of the cured product. Inorganic particles such as alumina, talc, magnesium hydroxide and zinc oxide are not preferable as many of them will for example lead to a high relative permittivity though a low dielectric tangent, or both a high relative permittivity and a high dielectric tangent.

There are no particular restrictions on the average particle size and shape of the inorganic filler; if molding a film or a substrate, preferred is a spherical inorganic filler having an average particle size of 0.5 to 5 µm, particularly preferably a spherical silica having an average particle size of 0.5 to 5 µm. Here, an average particle size is a value obtained as a mass average value $D_{50}$ (or median size) in a particle size distribution measurement conducted by a laser diffraction method.

Further, in order to improve the property of the inorganic filler, the inorganic filler is preferably one that has already been surface-treated with a silane coupling agent having organic groups capable of reacting with maleimide groups. Examples of such silane coupling agent include an epoxy group-containing alkoxysilane, an amino group-containing alkoxysilane, a (meth)acrylic group-containing alkoxysilane, and an alkenyl group-containing alkoxysilane.

As the above silane coupling agent, preferred is a (meth)acrylic group- and/or amino group-containing alkoxysilane, specific examples of which include 3-methacryloxypropyltrimethoxysilane, 3-acryloxypropyltrimethoxysilane, N-phenyl-3-aminopropyltrimethoxysilane, N-2-(aminoethyl)-3-aminopropyltrimethoxysilane, and 3-aminopropyltrimethoxysilane.

Heat-Curable Resin Having Reactive Group Capable of Reacting with Maleimide Group The heat-curable maleimide resin composition used in the method of the present invention for producing a cured product may also contain a heat-curable resin having reactive groups capable of reacting with maleimide groups.

There are no restrictions on the type of such heat-curable resin, examples of which may include various resins other than the component (A), such as an epoxy resin, a phenolic resin, a melamine resin, a silicone resin, a cyclic imide resin as typified by a maleimide compound other than the component (A), a urea resin, a heat-curable polyimide resin, a modified polyphenylene ether resin, a heat-curable acrylic resin, and an epoxy-silicone hybrid resin. Further, examples of the reactive groups capable of reacting with maleimide groups include an epoxy group, a maleimide group, a hydroxyl group, an acid anhydride group, an alkenyl group such as an allyl group and a vinyl group, a (meth)acryloyl group, and a thiol group. Here, the reactive groups capable of reacting with maleimide groups may also include, for example, those generating active species when reacted with imidazole and undergoing anionic polymerization when reacted with maleimide groups, such as an epoxy group.

In terms of reactivity, it is preferred that the reactive group in the heat-curable resin be one selected from an epoxy group, a maleimide group, a hydroxyl group and an alkenyl group; and in terms of dielectric property, an alkenyl group or a (meth)acryloyl group are more preferred.

Here, the heat-curable resin having the reactive groups capable of reacting with maleimide groups is added in an amount of 0 to 60% by mass per a sum total of the heat-curable resins.

Reaction Initiator/Reaction Promoter

The heat-curable maleimide resin composition used in the method of the present invention for producing a cured product may also contain a reaction initiator or a reaction promoter that are different from the component (B). Such reaction initiator or reaction promoter is used to initiate or promote a reaction between maleimide groups themselves; and reactions other than radical polymerization between maleimide groups and double bonds in the heat-curable resin having reactive groups capable of reacting with maleimide groups. For example, if an epoxy group-containing compound is used as the heat-curable resin having reactive groups capable of reacting with maleimide groups, by adding imidazole as a reaction initiator or reaction promoter, imidazole groups will act on epoxy groups to yield an active species, and this active species will then react with maleimide groups to initiate anionic polymerization. Preferable examples of such reaction initiator or reaction promoter used in the above reactions include imidazole, an organophosphorus-based compound and an amine compound. Further, as a reaction initiator or reaction promoter, there may be listed organic metal compounds such as aluminum chelate and zinc stearate.

Others

In addition to the above additives, there may also be added, for example, a non-functional silicone oil, a reactive diluent, a thermoplastic resin, an organic rubber, a thermoplastic elastomer, an organic filler, a photosensitizer, a light stabilizer, a polymerization inhibitor, a flame retardant, a pigment, a dye, an adhesion aid and an ion-trapping agent.

Further, the above silane coupling agents such as an epoxy group-containing alkoxysilane, an amino group-containing alkoxysilane, a (meth)acryloyl group-containing alkoxysilane and an alkenyl group-containing alkoxysilane that are used for surface-treating the inorganic filler, may be separately added to the heat-curable maleimide resin composition used in the method of the present invention for producing a cured product, and specific examples thereof may be ones that are similar to those listed above.

The heat-curable maleimide resin composition used in the present invention can be prepared by appropriately mixing the above components, and using, if necessary, a kneading device such as a triple roll mill, a ball mill, a bead mill and a sand mill, or even a mixing device such as a high-speed rotating mixer, a super mixer and a planetary mixer.

The heat-curable maleimide resin composition used in the present invention may also be dissolved in an organic solvent so as to be treated as a varnish. When in the form of a varnish, the composition can be easily turned into a film, and can also be easily applied to and easily impregnate a glass cloth made of an E glass, a low-dielectric glass, a quartz glass or the like. There are no restrictions on the organic solvent used so long as it is able to dissolve the components (A) and (B) and, as one of the other additives, the heat-curable resin having reactive groups capable of reacting with maleimide groups; examples of such organic solvent may include anisole, tetralin, mesitylene, xylene, toluene, tetrahydrofuran (THF), dimethylformamide (DMF), dimethylsulfoxide (DMSO) and acetonitrile, of which preferred are aromatic organic solvents such as anisole, tetralin, mesitylene, xylene and toluene. While a ketone-based solvent such as methyl ethyl ketone (MEK) and methyl isobutyl ketone (MIBK) is also often used for preparing a varnish, the usage of such type of solvent may not always be preferable as the maleimide compound as the component (A) used in the present invention has a low solubility to these ketone-based solvents. Any one kind of these organic solvents may be used alone, or two or more kinds of them may be used in combination. In terms of workability, it is preferred that a ratio between the heat-curable maleimide resin composition and the organic solvent in the varnish be adjusted to one where the heat-curable maleimide resin composition is present in an amount of 30 to 70% by mass.

Next, there are described in detail members or the like that are used in the method of the present invention for producing a cured product.

Release Sheet

In the method of the present invention for producing the cured product of the heat-curable maleimide resin composition, the release sheet remains unpeeled until the curing step, and will be peeled away after the heat-curable maleimide resin composition has cured via the curing step. There are no particular restrictions on the release sheet used in the present invention so long as it has a shape of a thin film used as a release sheet in this field; a plastic film and a metal foil are preferred, of which a plastic film is particularly preferred. As a material of such plastic film, there may be listed, for example, polyolefin resins such as a polyethylene (PE) resin, a polypropylene (PP) resin, and a polystyrene (PS) resin; polyester resins such as a polyethylene terephthalate (PET) resin, a polybutylene terephthalate (PBT) resin, and a polycarbonate (PC) resin; and fluorinated resins. Here, in terms of availability, preferred is a film made of a PET resin. Particularly, in terms of workability, it is preferred that the release sheet have a thickness of 10 to 150 μm, more preferably 20 to 70 μm. Further, in order to improve the appearance of the cured product obtained and formation of fine wiring, it is preferred that the release sheet have a surface roughness (Ra) of not higher than 100 nm, more preferably not higher than 50 nm. Especially, if the release sheet is a metal foil, its thickness shall fall into the above ranges for the purpose of avoiding cracks on surface. Moreover, in terms of avoiding leakage of the resin layer and entry of oxygen in the curing step, it is preferred that the release sheet be of a size that is larger than the area of the resin layer in a top view, more preferably a size that is larger than the area of the resin layer in the top view by 5% or more.

Further, in terms of removing the release sheet after curing the heat-curable maleimide resin composition, it is preferred that the release sheet be one that has already been subjected to a mold release treatment, more preferably one in which at least a surface that is to be in contact with the resin layer made of the heat-curable maleimide resin composition has been subjected to a mold release treatment. There are no particular restrictions on a mold release agent used in the mold release treatment; there may for example be used a silicone-based mold release agent, a fluorine-based mold release agent, an alkyd resin-based mold release agent and the like.

Base Material

The base material used in the present invention may be selected from a metal foil, a silicon wafer, a SiC wafer, a sapphire wafer, a compound semiconductor wafer, an organic substrate and a ceramic substrate.

The metal foil may for example be a copper foil, an aluminum foil or the like. The compound semiconductor wafer may for example be a gallium nitride wafer, an indium phosphide wafer, a gallium arsenide wafer, a gallium phosphide wafer or the like. Further, the organic substrate may for example be a glass epoxy substrate, a polyester substrate, a polyimide substrate, a BT substrate as well as a substrate made of a heat-curable resin composition and a glass cloth;

whether the substrate has a patterned conductor layer (i.e. conductor layer on which a circuit has been formed) is not questioned.

Method for Producing Cured Product

A method of the present invention for producing a cured product has:

a laminating step of obtaining a laminate by laminating the release sheet, the resin layer made of the heat-curable maleimide resin composition, and the base material, in such order; and a curing step of heating the laminate to a temperature at which the heat-curable maleimide resin composition of the resin layer cures, without removing the release sheet of the laminate. Here, the expression "such order" refers to a positional order, not a temporal order.

The method may also include other steps on the premise that the effects of the present invention will not be impaired.

Laminating Step

FIG. 1A is a schematic drawing (cross-sectional end view) showing a laminate of a resin layer 2 made of the heat-curable maleimide resin composition and a release sheet 1. Here, the laminate of the resin layer 2 made of the heat-curable maleimide resin composition and the release sheet 1 is referred to as a "laminate A10"; and the release sheet that is in contact with the resin layer 2 made of the heat-curable maleimide resin composition may be referred to as a "release sheet a" so as to be distinguished from another release sheet described later.

This laminate A10 may for example be obtained by applying the varnish of the heat-curable maleimide resin composition to one surface of the release sheet 1, and then volatilizing the organic solvent.

For example, after applying the varnish of the heat-curable maleimide resin composition dissolved in the organic solvent to one surface of the release sheet 1, heating is performed at a temperature of normally 70° C. or higher, preferably 80° C. or higher for 0.5 to 30 min to remove the organic solvent, thereby allowing the resin layer 2 having a high property uniformity to be formed on the one surface of the release sheet 1. There are no particular restrictions on a method for applying the varnish; the varnish may for example be applied using a spin coater, a slit coater, a sprayer, a dip coater, a bar coater or the like. Further, while there are no particular limitations on the thickness of a coating layer, it is preferred that this thickness be 1 to 300 μm, more preferably 1 to 200 μm.

Alternatively, there may be employed a procedure where the components of the heat-curable maleimide resin composition are to be preliminarily mixed together in advance and then pushed out into the shape of a sheet or a film using a melt kneading machine, whereafter the product pushed out is to be placed on one surface of the release sheet 1; or a procedure where the heat-curable maleimide resin composition is to be crushed into the shapes of tablets or granules and then stretched into the shape of a sheet or a film by hot press, whereafter the product stretched is to be placed on one surface of the release sheet 1. As for such heat-curable maleimide resin composition that has been molded into the shape of a sheet or a film (i.e. sheet or film of heat-curable maleimide resin composition), there may be placed on one surface of the release sheet 1 one layer of such sheet or film, or multiple layers of such sheet or film.

Further, as the resin layer 2 of the heat-curable maleimide resin composition, a prepreg prepared by impregnating a fiber base material with the heat-curable maleimide resin composition, preferably the varnish of the heat-curable maleimide resin composition may be placed on one surface of the release sheet 1.

Figure 2:
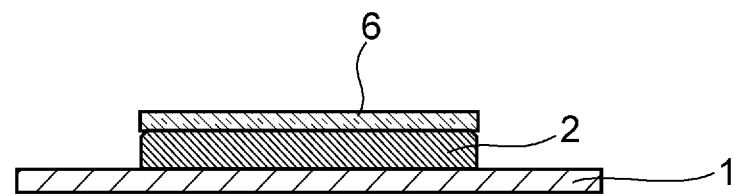
FIG. 2 is a schematic drawing showing an example of a laminate A.

While a cover film 6 may be disposed on the resin layer 2 side of the laminate A10 in order to protect the resin layer 2 (a cross-sectional end view is shown in FIG. 2), the cover film 6 needs to be removed beforehand in a step of laminating a later-described base material 3. Here, the cover film 6 is used as a protective film and is to be removed when laminating the base material, which makes the cover film 6 different from the release sheet. The material of the cover film 6 may, for example, be a polyolefin resin such as a polyethylene (PE) resin, a polypropylene (PP) resin and a polystyrene (PS) resin; and a polyester resin such as a polyethylene terephthalate (PET) resin, a polybutylene terephthalate (PBT) resin and a polycarbonate (PC) resin. The cover film 6 has an adhesive layer on its surface (a surface that comes into contact with the resin layer 2), and preferably has a thickness of 3 to 100 μm, more preferably 3 to 50 μm.

Next, the laminate A10 and the base material 3 are laminated together so that the surface of the resin layer 2 of the laminate A will come into contact with the base material 3, thereby obtaining a laminate with the release sheet 1, the resin layer 2 made of the heat-curable maleimide resin composition, and the base material 3 being laminated in such order. In order to differentiate such laminate having the three layers which are the release sheet 1, the resin layer 2 made of the heat-curable maleimide resin composition, and the base material 3 from other laminate(s), the laminate may be referred to as a "laminate B11."

Specifically, it is preferred that lamination be carried out in such a manner that the laminate A10 shown in FIG. 1A is flipped and then placed on the base material 3 as shown in FIG. 1B to FIG. 1E.

As the laminating step, in terms of easily achieving a uniform condition of contact and workability, preferred is a method of pressure-bonding the laminate B by a roller pressure, press pressure or the like. Particularly, a vacuum laminating method is preferably used. Further, the laminating method may be performed in either a batch-wise or a continuous manner.

A commercially available vacuum laminator may be used as a vacuum laminator.

FIG. 1B to FIG. 1E are schematic drawings showing an example of the laminating step using the vacuum laminator.

At first, the laminate A is to be placed on the base material 3 so that the surface of the resin layer 2 will come into contact with the base material 3, after which they are put into a laminator 20.

Subsequently, by reducing the pressure inside the system of the laminator 20, a rubber plate 4 on the upper surface will come down to establish a state where the release sheet 1 and the resin layer are in contact with the base material 3.

The resin layer 2 softens when heated by a heater (not shown)-equipped plate 5 of the laminator 20, and the release sheet 1 and the resin layer 2 will be pressure-bonded to the base material 3 when pressurized by the upper surface plate 5. Here, at that time, heating by the plate 5 of the laminator 20 is carried out for such a short period of time that the resin layer 2 is allowed to soften; for example, the heating is performed for not longer than 5 min, preferably 15 sec to 5 min. The time period is of a range where the curing of the resin layer 2 will not progress.

In the end, the pressure reduction in the system is cancelled to obtain the laminate B11.

A heating temperature is preferably 40 to 160° C.; when the heating temperature is within this range, the heat-curable maleimide resin composition will soften, but will not flow out, whereby the release sheet 1 and the resin layer 2 can be easily pressure-bonded to the base material 3.

Further, at that time, the temperatures of the upper surface and lower surface plates 5 may be set differently from each other. Moreover, a pressure-bonding pressure is preferably 0.1 to 1.5 MPa; when the pressure-bonding pressure is within this range, the release sheet 1 and the resin layer 2 can be easily pressure-bonded to the base material 3 without causing the resin composition to flow out. Here, it is preferred that lamination be performed under a reduced air pressure of not higher than 30 hPa.

Figure 3A:
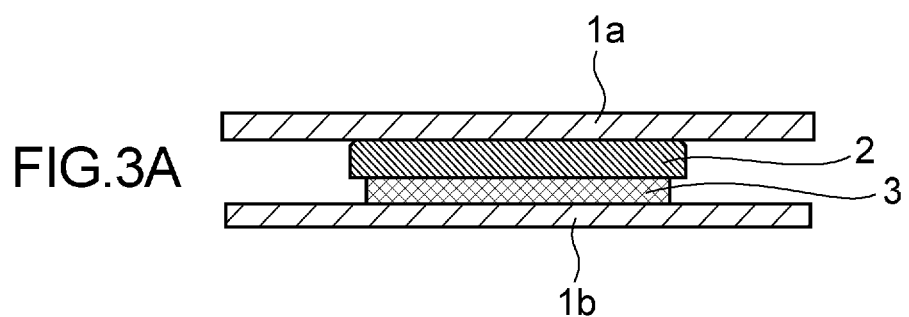
FIG. 3A is a schematic drawing showing a laminate having two release sheets before a laminating step.
Figure 3B:
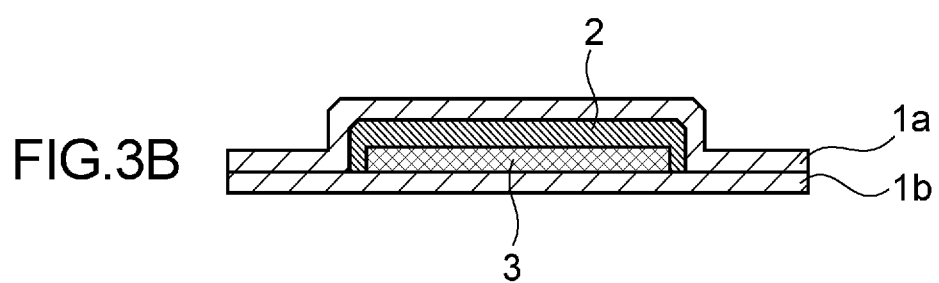
FIG. 3B is a schematic drawing showing the laminate having the two release sheets after the laminating step.

In the laminating step, in addition to the release sheet a, there may further be placed another release sheet b. That is, when for example putting a laminate into the laminator 20, the base material 3 may be placed on such release sheet 1b, followed by placing and laminating the laminate A10 on the base material 3 so that the surface of the resin layer 2 will come into contact with the base material 3, thereby establishing a laminate having at least four layers which are the release sheet 1a, the resin layer 2 made of the heat-curable maleimide resin composition, the base material 3, and the release sheet 1b. FIG. 3A is a schematic drawing (cross-sectional end view) showing a laminated state in this embodiment; FIG. 3B is a schematic drawing (cross-sectional end view) showing a laminate obtained after the laminating step.

A mode having the release sheet b is preferrable, because the leakage of the resin layer 2 can be prevented if using a vacuum laminator in the laminating step, and oxygen entry can be further prevented in the later-described curing step.

Further, the two release sheets a and b used at that time may be either identical to or different from each other in type.

Curing Step

In the curing step, by heating the laminate B11 to a temperature at which the heat-curable maleimide resin composition of the resin layer 2 cures without peeling off the release sheet 1 of the laminate B11, the heat-curable maleimide resin composition of the resin layer 2 is cured. Curing conditions may vary depending on, for example, the type of the component (B) used; in general, a curing temperature is 120 to 200° C., and a curing time is 15 to 600 min. If the release sheet 1 is peeled off before curing, the heat-curable maleimide resin composition will be cured in an insufficient manner even when cured under a nitrogen atmosphere; particularly, in such case, a strong tackiness will occur on the surface of the resin layer 2 when heated, and appearance defects will occur easily.

Pressurization may or may not be necessarily performed in the curing step; for example, as shown in FIGS. 1B to 1F, the laminate B11 obtained in the laminating step may be put into and thermally cured in an oven 30 set to the curing temperature as it is without peeling off the release sheet 1.

Figure 1G:
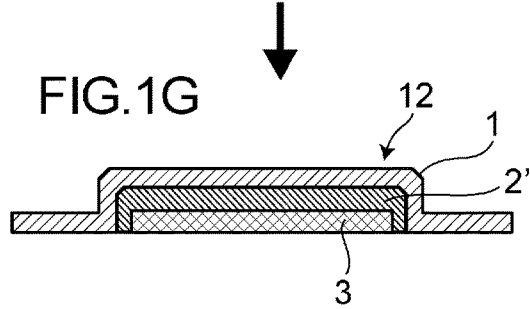
FIG. 1G is a schematic drawing showing part of the example of the method of the present invention for producing the cured product.
Figure 1H:
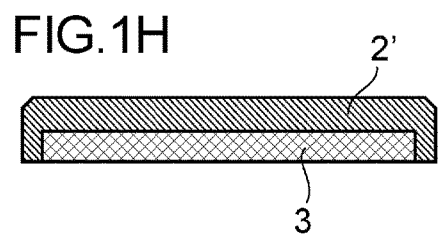
FIG. 1H is a schematic drawing showing part of the example of the method of the present invention for producing the cured product.

After the curing step, the release sheet 1 may be appropriately removed (FIG. 1H), at time of use, from a laminate B12 (FIG. 1G) having a cured resin layer 2' obtained; as a method for removing the release sheet 1, it is normally removed either manually or mechanically with the aid of an automatic peeling device. Even from this perspective, it is preferred that the release sheet 1 be one in which at least the surface that is to be in contact with the resin layer 2 has been subjected to a mold release treatment. If a metal foil is used as the release sheet 1, the release sheet 1 may also be removed via etching.

The cured product (cured film) of the heat-curable maleimide resin composition that is obtained by the method of the present invention for producing a cured product, is superior in heat resistance, mechanical properties, electrical properties, adhesiveness to base materials, and solvent resistance, and even has a low relative permittivity.

Thus, the cured product obtained by the method of the present invention can be applied to, for example, materials for use in a rigid/flexible printed-wiring board and a semiconductor device, specifically a solder resist, a coverlay film, and a passivation film or protective film provided on the surface of a semiconductor element; a junction protective film for use in the junctions of a diode, a transistor or the like; an α-ray shielding film or interlayer insulating film for use in a VLSI; and an ion implantation mask. Moreover, the cured product produced by the present invention may also be applied to a conformal coating of a printed-circuit board, an oriented film of a liquid crystal surface element, a protective film of glass fibers, and a surface protective film of a solar cell.

WORKING EXAMPLES

The present invention is described in detail hereunder with reference to working and comparative examples; however, the present invention shall not be limited to the following working examples.

Preparation of laminate A1 Having Resin Layer Made of Heat-Curable Maleimide Resin Composition Here, 100 parts of a dimer acid frame-derived hydrocarbon group-containing bismaleimide compound represented by the following formula (4) (SLK-3000 by Shin-Etsu Chemical Co., Ltd., number average molecular weight: 5,500), 1 part of di-t-butylperoxide (Trigonox B by KAYAKU NOURYON CORPORATION) and 85 parts of toluene were put into a 500 mL four-necked flask equipped with a Dimroth condenser and a stirrer, followed by heating and melting them while performing stirring at 50° C. for an hour, thereby obtaining a varnish.

A die coater was used to apply such varnish to a 50 μm-thick PET film that has been subjected to a mold release treatment (TNT-010 by TOYOBO STC CO., LTD), followed by using a hot air drying furnace to perform heating at 100° C. for 5 min so as to eliminate the solvent, thereby obtaining a laminate A1 having a resin layer made of a heat-curable maleimide resin composition, as shown in FIG. 1A. The thickness of the resin layer was 50 μm.

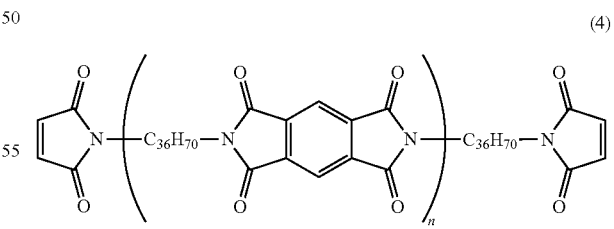

(4)

—$C_{36}H_{70}$-represents a dimer acid frame-derived structure.
n≈5 (Average value)

Preparation of Laminate A2 Having Resin Layer Made of Heat-Curable Maleimide Resin Composition Here, 100 parts of a dimer acid frame-derived hydrocarbon group-containing bismaleimide compound represented by the following formula (5) (BMI-2500 by Designer Molecules Inc., number average molecular weight: 6,000), 1 part of di-t-butylperoxide (Trigonox B by KAYAKU NOURYON CORPORATION) and 85 parts of toluene were put into a 500 mL four-necked flask equipped with a Dimroth condenser and a stirrer, followed by heating and melting them while performing stirring at 50° C. for an hour, thereby obtaining a varnish.

A die coater was used to apply such varnish to a 50 µm-thick PET film that has been subjected to a mold release treatment (TNT-010 by TOYOBO STC CO., LTD), followed by using a hot air drying furnace to perform heating at 100° C. for 5 min so as to eliminate the solvent, thereby obtaining a laminate A2 having a resin layer made of a heat-curable maleimide resin composition, as shown in FIG. 1A. The thickness of the resin layer was 50 µm.

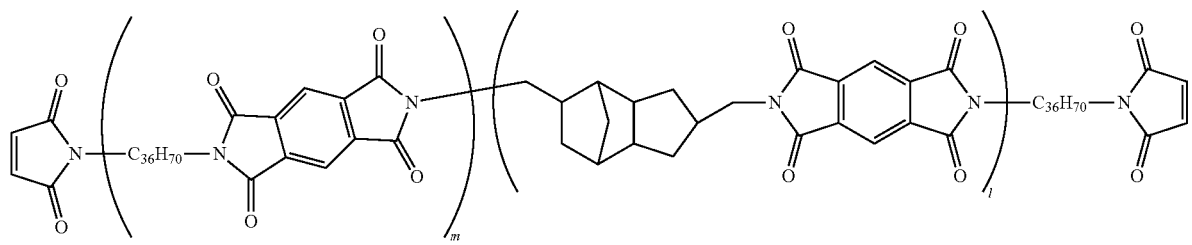

(5)

—$C_{36}H_{70}$—represents a dimer acid frame-derived structure.
l≈5 (Average value), m≈1 (Average value)

Laminating Step

An 8-inch silicon wafer as a substrate was placed on a PET film (TNT-010 by TOYOBO STC CO., LTD) that served as the release sheet b and had been subjected to a mold release treatment, followed by placing the laminate A1 or A2 produced on such silicon wafer so that the resin layer thereof would come into contact with the silicon wafer, whereby the four layers which were the release sheet (PET film), silicon wafer, resin layer and release sheet (PET film) were allowed to be stacked in this order, and a batch-type vacuum laminator (by Nikko-Materials Co., Ltd.) was then used to laminate and pressure-bond them to obtain a laminate. Laminating conditions were such that after it was confirmed that the air pressure had dropped to 10 hPa or lower by performing depressurization for 20 sec, pressure-bonding was performed at a temperature of 90° C. and a pressure of 0.4 MPa for 30 sec. Here, as shown in FIG. 3A, when putting the layers into the vacuum laminator, the release sheets a and b used were each larger than the area of the resin layer of the laminate A1 or A2 by 8% or more in a top view, whereby a laminate shown in FIG. 3B was obtained.

Curing Step

As shown in the following Table 1, in each of the working examples 1 to 3, the laminate was put into an inert oven DN411I manufactured by Yamato Scientific Co., Ltd. without peeling off the two release sheets on the outermost surfaces of the laminate, where heating was performed at 180° C. for 90 min to cure the heat-curable maleimide resin composition of the resin layer.

After curing, the two release sheets on the outermost surfaces of the laminate were peeled away by hand.

In contrast, in each of the comparative examples 1 to 4, the two release sheets on the outermost surfaces were removed from the laminate before curing the resin composition under a similar condition(s) as the working examples. Here, the atmospheres in the oven (curing atmospheres) are shown in Table 1.

Appearance Observation

The cured product produced under the above curing conditions was taken out of the oven and visually observed so as to have its appearance evaluated, in which "○" was given to examples where the resin layer had no wrinkles or crinkles, whereas "x" was given to examples where wrinkles or crinkles had occurred.

Curability Observation

After curing, the resin layer-mounted silicon wafer from which the two release sheets had been peeled away was placed on a hot plate of 120° C., and a spatula was then used to poke the surface of the resin layer, in which "○" was given to examples where neither scratches nor tackiness was observed on the resin layer, whereas "x" was given to examples where scratches had easily occurred, and/or the resin had adhered to the spatula due to tackiness.

TABLE 1

| | Working example | | | Comparative example | | | |
|---|---|---|---|---|---|---|---|
| | 1 | 2 | 3 | 1 | 2 | 3 | 4 |
| Resin layer | 1 | 1 | 2 | 1 | 1 | 2 | 2 |
| Curing atmosphere | Nitrogen | Air | Nitrogen | Air | Nitrogen | Air | Nitrogen |
| Appearance | ○ | ○ | ○ | x | x | x | ○ |
| Curability | ○ | ○ | ○ | x | x | x | x |

In each of the working examples 1 to 3, the cured product obtained exhibited a favorable appearance and curability regardless of whether the curing atmosphere was a nitrogen atmosphere or an air atmosphere. Meanwhile, in each of the comparative examples 1 to 3, regardless of the curing atmosphere, the occurrence of many wrinkles and crinkles was observed on the appearance due to the hot air generated in the oven; whereas in the comparative example 4, a favorable appearance was achieved probably due to the fact that radical reaction on the surface had slightly progressed under the nitrogen atmosphere. However, in all the comparative examples, the results were such that curability was insufficient, and the resin had for example significantly deformed and/or been damaged due to an external force at the time of heating.

What is claimed is:
1. A method for producing a cured product of a heat-curable maleimide resin composition containing:
(A) a maleimide compound having at least one dimer acid frame-derived hydrocarbon group per molecule; and

(B) a radical polymerization initiator,
wherein the method comprises:
a laminating step of obtaining a laminate by laminating a release sheet, a resin layer made of the heat-curable maleimide resin composition, and a base material, in such order; and
a curing step of heating the laminate to a temperature at which the heat-curable maleimide resin composition of the resin layer cures, without removing the release sheet of the laminate.

2. The method for producing the cured product of the heat-curable maleimide resin composition according to claim 1, wherein the laminating step is a step in which another release sheet is to be placed on a surface of the base material that is not in contact with the resin layer to obtain a laminate having at least four layers which are the release sheet, the resin layer made of the heat-curable maleimide resin composition, the base material, and the another release sheet.

3. The method for producing the cured product of the heat-curable maleimide resin composition according to claim 1, wherein the component (A) is a maleimide compound represented by the following formulae (1) and/or (2):

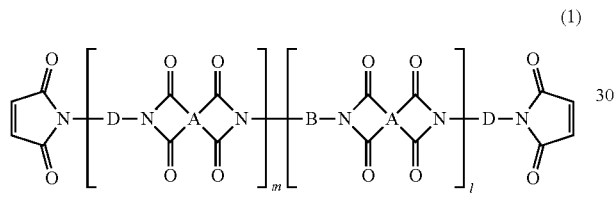

(1)

wherein, A independently represents a tetravalent organic group having a cyclic structure; B independently represents a divalent alicyclic hydrocarbon group having 6 to 60 carbon atoms; D independently represents a divalent hydrocarbon group having 6 to 200 carbon atoms, in which at least one D is a dimer acid frame-derived hydrocarbon group; m is 1 to 100; l is 1 to 200; no restrictions are imposed on an order of each repeating unit identified by m and l, and a bonding pattern may be alternate, block or random,

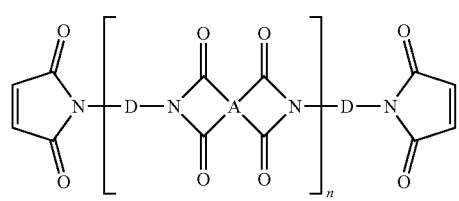

(2)

wherein A independently represents a tetravalent organic group having a cyclic structure; D independently represents a divalent hydrocarbon group having 6 to 200 carbon atoms, in which at least one D is a dimer acid frame-derived hydrocarbon group; n is 0 to 100.

4. The method for producing the cured product of the heat-curable maleimide resin composition according to claim 3, wherein A in the formulae (1) and (2) is a tetravalent organic group represented by any of the following structural formulae:

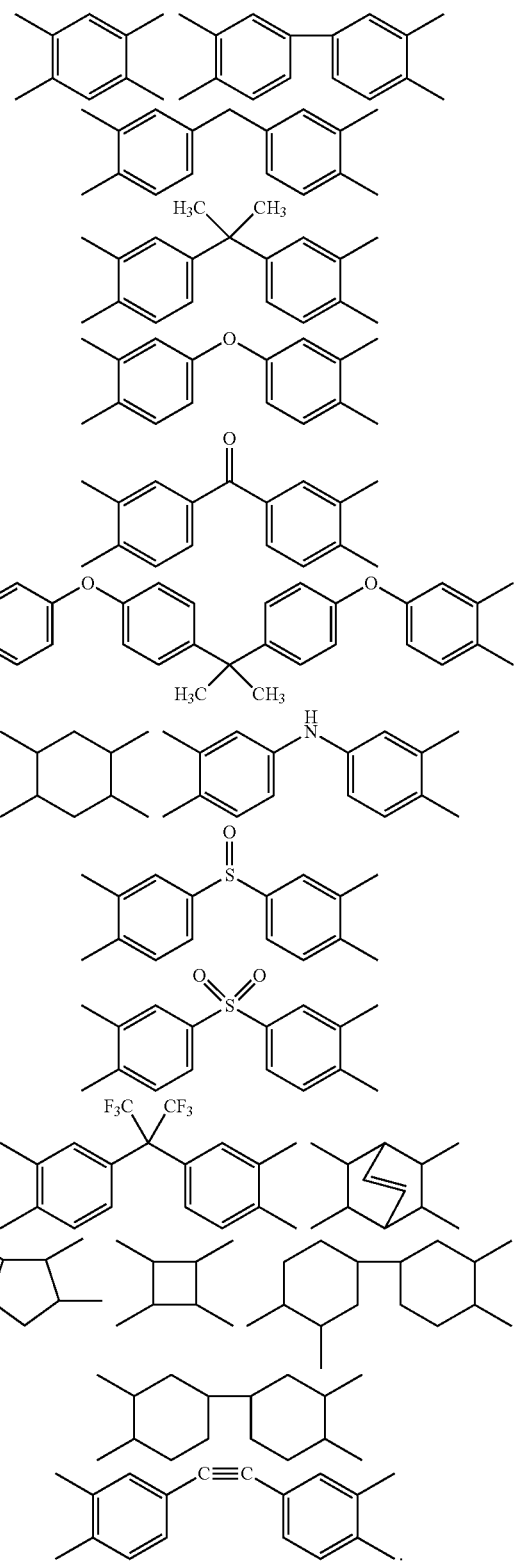

5. The method for producing the cured product of the heat-curable maleimide resin composition according to claim 1, wherein the radical polymerization initiator as the component (B) is an organic peroxide.

6. The method for producing the cured product of the heat-curable maleimide resin composition according to claim 1, wherein the release sheet is a plastic film in which a surface that is to be in contact with the resin layer made of the heat-curable maleimide resin composition has been subjected to a mold release treatment.

7. The method for producing the cured product of the heat-curable maleimide resin composition according to claim 1, wherein the base material is at least one kind selected from a metal foil, a silicon wafer, a SiC wafer, a sapphire wafer, a compound semiconductor wafer, an organic substrate and a ceramic substrate.

8. The method for producing the cured product of the heat-curable maleimide resin composition according to claim 1, wherein the resin layer has a thickness of 1 to 300 μm.

* * * * *